June 30, 1953 E. J. ZIKMUND ET AL 2,644,063

SWITCH WAFER MOUNTING CLIP

Filed May 21, 1951

Inventors:
Edward J. Zikmund,
Samuel E. Hatchett,
by Merton D Morse
Their Attorney.

Patented June 30, 1953 2,644,063

UNITED STATES PATENT OFFICE 2,644,063

SWITCH WAFER MOUNTING CLIP

Edward J. Zikmund and Samuel E. Hatchett, Syracuse, N. Y., assignors to General Electric Company, a corporation of New York Application May 21, 1951, Serial No. 227,345

7 Claims. (Cl. 200—168)

Our invention relates to terminal panel assemblies for electrical apparatus, and more particularly to terminal panel mounting assemblies which are quickly detachable. While our invention is of general utility, it has particular application to radio switch wafer assemblies of the multi-unit or gang type.

In many instances it has been found desirable to mount electrical apparatus on a plurality of panels or wafers and for convenience to assemble these multi-unit arrangements in tiered relationship. This is especially true in the case of gang switches used in radio receivers and other electrical instruments wherein a plurality of circuits are to be switched.

In the past these gang switches have generally comprised a plurality of switch wafers, each wafer having its own switching member. A common actuating shaft was provided to operate all the individual switches simultaneously. In either the manufacturing and assembling of such switch units or in the continued use of such switch units it has been found that occasionally a switch wafer may become defective. It is then desirable to remove and replace that particular faulty wafer rather than the entire gang switch.

In prior art arrangements the switch wafers have been either bolted together along a common shaft, the shaft extending through holes in each wafer or each wafer has been secured to a transverse support member by means of riveted brackets. In both arrangements it has been difficult to replace a single faulty switch wafer without either withdrawing the supporting shafts or knocking out the riveted angle brackets. In both cases the removal of such a wafer is a time consuming, tedious task which, in addition to being burdensome, may dislocate adjacent wired wafers with deleterious effects.

We have found that it is possible to accomplish the removal of individual defective switch wafers in gang switch assemblies in a simple and convenient manner.

It is accordingly a primary object of our invention to provide a quick detachable assembly for mounting electrical apparatus in which the mounting panel is releasably secured to a supporting member.

Another object of our invention is to provide a new and improved multi-unit switch wafer assembly in which each switch wafer may be quickly detached from common support means without disturbing adjacent wafers.

Still another object of our invention is to provide an improved gang switch arrangement wherein each switch wafer is detachably secured to common support members by means of spring clip members.

More specifically, it is an object of our invention to provide a new and improved tiered panel mounting assembly which is particularly adapted to gang switches and in which each mounting panel or wafer is quickly detachable from common support means and secured thereto by spring clip members.

For additional objects and advantages, and for a better understanding of our invention, attention is now directed to the following description and accompanying drawings. The features of our invention which are believed to be novel are particularly pointed out in the appended claims.

Figures 1, 2:
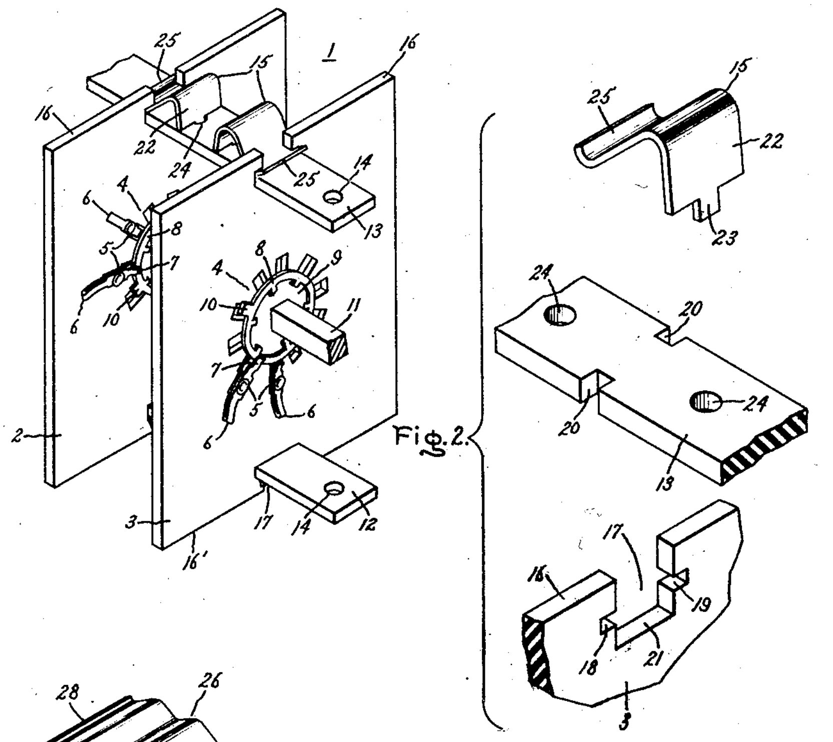
Fig. 1 is a perspective view of two sections of a gang switch constructed and supported in accordance with the teaching of the present invention.
Fig. 2 is an exploded perspective view of the structural arrangement for quick detachably securing the switch wafers of Fig. 1 to a common support member.

Referring to Fig. 1, there is shown a portion of a gang switch 1 assembled in accordance with the teaching of our invention in which two mounting wafers or sections, 2 and 3, are illustrated. Each wafer includes a rotary switch 4. While the details of each switch do not form a part of this invention and are amply described in the prior art, it may be generally stated that the switch 4 comprises a plurality of contact members 5 which are riveted or eyeleted to the wafer and include a lug or tab portion 6 to which suitable connections may be soldered. Each contact member also includes a pair of spring or resilient jaws 7 which cooperate with portions of a circular contact plate 8 secured to a centrally disposed insulating rotor member 9. Two such circular contact plates 8 are provided—one on each side of the rotor member 9. Each circular contact plate 8 extends beyond the periphery of the rotor member 9 and cooperates with one surface of the wafer 3 so as to position rotatably the rotor member 9 within the wafer. Tongues 10 extend from the circular contact plate 8 and are adapted to engage the desired contact members 5. It will be obvious that any number of contact members may be used and that there are practically an infinite number of switching combinations that may be provided. The rotors 9 and the individual wafers 2 and 3, which with their associated contact members 5 provide the stationary contact assembly of the rotary switch, have a common central axis which in the case of the gang switch may be thought of as the actuating shaft 11. It will be appreciated that this shaft 11 will generally be connected to a control knob (not shown) and which may be removed when any switch wafer is to be withdrawn.

The individual switch wafers 2 and 3 are supported by two parallel support members 12 and 13. The body of the switch mounting wafer and also the support members may be composed of an insulating material. The support members include holes 14 at opposite ends thereof for mounting the assembly in any convenient manner.

The manner in which the switch wafers shown in Fig. 1 are releasably secured to the supporting members is best illustrated by referring to Fig. 2 which is a fragmentary exploded view of the assembly of Fig. 1 near the upper edge 16 of wafer 3. The upper edge 16 has a support receiving opening 17 which comprises a recessed or indented open slot. This slot is substantially U-shaped and includes oppositely disposed guide notch portions 18 and 19 in the side walls thereof.

The transverse support member 13 comprises an elongated body of insulating material having, at spaced intervals along its length, oppositely disposed notches or indexing portions 20. The portion of the transverse support member 13 between the opposed index notches 20 is approximately the width of the bottom 21 of the open slot or recessed opening 17 appearing at the edge of the disk wafer 3. This portion of reduced dimension is adapted to fit into the slot 17 at the bottom 21 thereof.

The spring clip member 15 shown in Figs. 1 and 2 is composed of an elongated strip of resilient material such as spring steel and is essentially S-shaped in its configuration. One depending end 22 of the spring clip member incorporates a tang or tongue portion 23 which is adapted to fit into suitably positioned apertures or sockets 24 of the transverse member 13. The tang and socket arrangement serves to anchor one end of the spring clip, lending greater rigidity to the assembled structure while still not detracting from the desirable feature of quick detachability.

In assembling the unit, the portion of reduced dimension of the transverse support member 13 is positioned at the bottom 21 of the U-shaped open slot. Then the end 25, remote from the tang portion 23, of the spring member 15 is positioned within the oppositely disposed notch portions 18 and 19 of the switch wafer 3. The end portion 22 is compressed until the tang portion 23 is in position within the locating aperture 24. The switch wafer 3 and supporting member 13 are then held in compression by means of the spring clip acting in engagement therewith. The wafer 3 may be quickly detached from the support member 13 by performing the above operation in reverse order.

Thus, each switch wafer is detachably secured to the transverse support members by means of the S-shaped spring clip members 15. While the exact supporting arrangement and method of assembling has been described in connection with Fig. 2, the exploded view, it also will be evident from Fig. 1 that the spring clip member 15 holds the wafer 3 and the support member 13 in compression and further that the spring member 15 may be quickly detached from the support and wafer member by compressing portion 22 of the clip 15 thereby, permitting the withdrawal of the tang 23 from the aperture 24. The end portion 25 may then be slipped out from between the guide notch portions 18 and 19, permitting the disengagement of the switch wafer 3 from the support member 13.

An opposite spring clip member 15 securing the other support member 12 to the other edge 16′ of the wafer 3 can be similarly detached. One of the two support members may then be removed by first releasing all the retaining spring clip members 15 engaging that support. The individual switch wafer 3 may then be readily withdrawn from the gang switch assembly after the shaft 11 is withdrawn from engagement with its associated rotor member 9.

The switch wafer 3 can thus be conveniently and quickly removed without the necessity of dislocating one of the two common support members 12 and 13 or the adjacent wafer 2. The assumed faulty wafer 3 may then, of course, be replaced with a new one and the removed support member may be repositioned. It will be noted that in order to provide a rigid assembly there should be at least a pair of transverse support members 12 and 13 and a corresponding number of openings 17 in each switch wafer.

While we have shown but one such S-shaped clip within each recessed porton of each switch wafer, it will be apparent that another such clip could be inserted from the opposite direction within the locating notch. With this in mind, we have shown two spaced apart tang locating apertures 24 which may receive the tongues or tangs 23 of opposing spring clip members 15, each of which makes engagement at one end thereof with each other, the guide notches 18 and 19 and the support member 13.

It will be evident that the openings 17 at the opposite edges 16 and 16′ of each switch wafer need not necessarily be U-shaped but that they might logically be designed to accommodate a circular support member which circular support member might incorporate a circular or annular indexing notch corresponding in function to the opposed index notches 20 of the elongated support member 13 shown in Fig. 2. Further, the exact shape of the opposed guide notches 18 and 19 within the disk wafer is not to be considered controlling as long as they are adapted to receive spring clip members.

Figure 3:
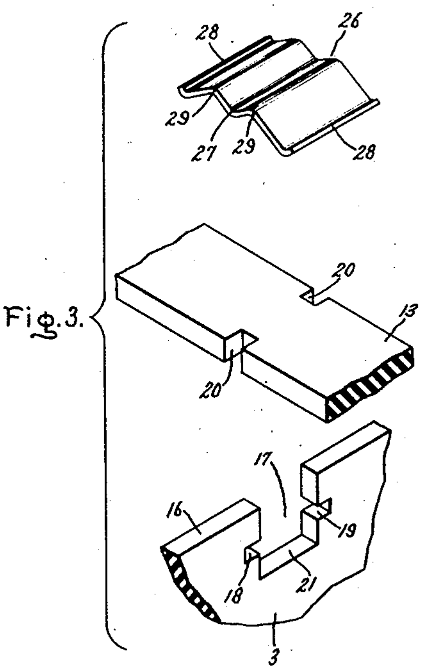
Fig. 3 is an exploded perspective view of another embodiment of our invention employing a different type of spring clip securing means.
Figure 4:
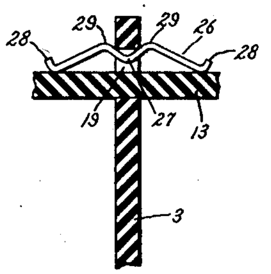
Fig. 4 illustrates in cross-sectional view the assembled relationship of the elements shown in Fig. 3.

Referring to Fig. 3, there is shown in exploded view a modification of the securing means used in our invention in which the opening 17 in the edge 16 of the wafer 3 is essentially the same as that described in connection with Fig. 2. The transverse support member 13 is essentially the same as the support member 13 shown in Fig. 2 except that the locating apertures 24 are not provided. However, a differently shaped spring clip member 26 is provided instead of the S-shaped clip 15 with tang 23 shown in Fig. 2. The spring clip member 26 is essentially bow-shaped having a centrally disposed lateral groove 27 with ribs 29 and upturned end portions 28. The wafer 3 and transverse support member 13 are generally assembled exactly as described in connection with Fig. 2. The spring clip member 26 in this modification is inserted in essentially the same manner as the S-shaped member 15 there described. In this embodiment the guide notches 18 and 19 within the recessed opening 17 are engaged by the central groove portion 27 of the bow-shaped spring clip member 26. Their relative positioning is shown in cross-sectional view in Fig. 4. It will be apparent that in this modification the transverse support member 13 is positioned exactly as before within the recessed opening 17 at the bottom 21 thereof and that the bow-shaped spring clip member is slid within the locating notch until the ribs 29 of the groove portion 27 engage the guide notches. The bow-shaped spring clip member 26 is initially flattened against the side of the transverse support member 13 while fitting it within the guide notch and is released when in its central position. It then functions in a manner similar to the S-shaped clip 15 shown in connection with Figs. 1 and 2, holding the transverse support member 13 in compression with the wafer 3. The assembly is similarly detached by performing the operation in reverse order. It will be noted that in this construction there is no tendency for the spring clip 26 to twist the strip 13 with respect to wafer 3, since the clip 26 applies equal and opposed bending torques on both sides of the mounting slot. In this respect it differs functionally from the construction of Figs. 1 and 2, wherein each spring clip 15 exerts pressure on one side of a slot, tending to rotate the support member about the base of that slot as a fulcrum.

While we have shown the switch wafer members as being essentially square, it will, of course, be obvious that the teaching of our invention could also be adapted to wafers having other configurations such as round or oblong wafers in which the necessary indentations or recesses at the edges thereof are oppositely disposed with respect to a central axis.

As heretofore mentioned, our improved terminal panel mounting assembly may be employed in arrangements other than gang switch units. For example, it might be desirable to mount other electrical components such as resistor-condenser sub-assemblies on similar mounting panels in the same tiered arrangement.

It will thus be apparent that we have provided a novel terminal panel mounting assembly comprising a plurality of wafer shaped panels in tiered arrangement and having common support members detachably secured thereto and especially such an arrangement employed in a gang switch whereby each switch wafer may be easily and readily detached from the whole without having to remove riveted connections or to disturb adjacent wafers.

While a specific embodiment of our invention has been shown and described and certain modifications therein have been suggested, it will, of course, be understood that various other modifications may be made without departing from the principles of the invention. The appended claims are therefore intended to cover any such modifications within the true spirit and scope of the invention.

What we claim as new and desire to secure by Letters Patent of the United States is:

1. A quickly detachable assembly for mounting electrical apparatus comprising a mounting wafer having a pair of spaced-apart support openings, means for supporting said wafer comprising a pair of elongated transverse members each fitting within one of said support openings and a pair of spring clips each releasably securing one of said transverse members to said wafer within one of said openings, each said spring clip having a detent portion cooperating with its adjacent transverse member and mounting wafer and constructed to resist lateral forces tending to disengage said clip from said opening.

2. A quickly detachable assembly for mounting multi-unit gang switches comprising a switch mounting wafer having a recessed support opening in one edge thereof, means supporting said switch mounting wafer comprising an elongated transverse member arranged to fit within said recessed support opening, said wafer also having a pair of notches in opposite sides of said opening lying above the surface of said member when fitted in said opening, and means comprising a spring clip arranged to engage said notches for releasably securing said transverse member to said switch mounting wafer.

3. A quickly detachable assembly for mounting multi-unit gang switches comprising a plurality of spaced apart parallel mounting wafers having a common central axis, each of said mounting wafers having a pair of oppositely disposed support openings with respect to said common axis, a pair of elongated transverse support members each extending through one of said support openings of each of said mounting wafers, and means releasably securing said transverse members to said wafers comprising spring clip members extending into said openings and engaging said transverse support members and said mounting wafers, each said clip member having a detent portion cooperating with its adjacent support member and mounting wafer and constructed to resist lateral forces tending to disengage the clip member from the opening.

4. A quickly detachable switch wafer mounting assembly comprising a plurality of spaced apart parallel mounting wafers having a common central axis, each of said wafers having a pair of oppositely disposed U-shaped indented support openings in edges thereof, each of said U-shaped openings having oppositely disposed guide notch portions in the side walls thereof, a plurality of elongated transverse support members, each of said members including spaced apart notched indexing portions fitting into each of said U-shaped openings, and means securing each of said transverse members within each of said support openings comprising a spring clip member fitted into said guide notch portions of said support opening and releasably securing said support member to said wafer member, each said clip member having a detent portion cooperating with its adjacent support member and mounting wafer and constructed to resist lateral forces tending to disengage the clip member from the opening.

5. A quickly detachable gang switch assembly comprising a plurality of spaced apart switch wafer members and a plurality of transverse support members, each of said wafer members having an indented U-shaped support receiving opening in the edge thereof, said U-shaped opening having oppositely disposed guide notches in the side walls thereof, each of said transverse support members comprising an elongated strip of insulating material having oppositely disposed indexing notches fitting within said U-shaped opening and including spaced apart locating apertures, and means releasably securing each of said support members within each of said U-shaped openings comprising an S-shaped spring clip member, one end of which fits within said oppositely disposed guide notch portions, the other end having a tang portion fitting within one of said locating apertures of said transverse support member, whereby said transverse member and said mounting wafer are held in compression.

6. A quickly detachable assembly for mounting multi-unit switches comprising a plurality of spaced apart parallel mounting wafers having a common central axis, each of said wafers having a U-shaped recess opening on one edge thereof, the side walls of said U-shaped recess having oppositely disposed guide notches therein, a plurality of transverse support members each comprising an elongated strip of insulating material having an indexing portion of reduced dimensions received in the U-shaped recesses of said wafers and means for securing said transverse members within each of the U-shaped recesses of said wafers, comprising a substantially bow-shaped spring clip member having a centrally disposed lateral groove adapted to engage said guide notches and the outer end portion engaging said transverse support member thereby releasably securing said mounting wafer to said transverse support member.

7. A gang switch assembly comprising a plurality of contact supporting wafers of insulating material, an elongated support member for retaining said wafers in spaced parallel relation, each of said wafers having a generally U-shaped recess opening on one edge thereof with opposed notches in the side walls of said recesses intermediate the edge of the respective wafers and the bottom of said recesses, said elongated support having opposed notches opening on the edges thereof at spaced points along the length thereof and received at said points in said recesses for interlocking engagement with the walls of the respective wafers defining said recesses, and a plurality of spring clips, one received in the notch of each wafer and engaging said support to detachably retain said support and the respective wafer in interlocking engagement, each said clip having a detent portion cooperating with its adjacent support member and wafer and constructed to resist lateral forces tending to disengage the clip from said notches.

EDWARD J. ZIKMUND.
SAMUEL E. HATCHETT.

References Cited in the file of this patent

UNITED STATES PATENTS

| Number | Name | Date |
|---|---|---|
| 995,630 | Naugle | June 20, 1911 |

FOREIGN PATENTS

| Number | Country | Date |
|---|---|---|
| 536,087 | Great Britain | May 1, 1941 |